(12) United States Patent
Chiu et al.

(10) Patent No.: US 9,986,661 B2
(45) Date of Patent: May 29, 2018

(54) WATER COOLING HEAT RADIATION DEVICE AND MODULE THEREOF

(71) Applicant: ASIA VITAL COMPONENTS CO., LTD., New Taipei (TW)

(72) Inventors: Jung-Yi Chiu, New Taipei (TW); Fu-Kuei Chang, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 74 days.

(21) Appl. No.: 15/275,495

(22) Filed: Sep. 26, 2016

(65) Prior Publication Data
US 2018/0092245 A1 Mar. 29, 2018

(51) Int. Cl.
*F28F 7/00* (2006.01)
*H05K 7/20* (2006.01)
*F28F 13/06* (2006.01)
*F28F 1/24* (2006.01)

(52) U.S. Cl.
CPC .......... *H05K 7/20263* (2013.01); *F28F 1/24* (2013.01); *F28F 13/06* (2013.01); *H05K 7/20154* (2013.01); *H05K 7/20272* (2013.01); *F28F 2250/08* (2013.01); *F28F 2250/102* (2013.01)

(58) Field of Classification Search
CPC .......... H05K 7/20263; H05K 7/20154; H05K 7/20272; F28F 1/24; F28F 13/06; F28F 2250/102; F28F 3/083; F28F 3/08; F28F 3/02; F28D 2021/0028; F28D 2021/0029; F28D 9/0081; F28D 9/0062; F28D 9/0037; F28D 9/0031; F28D 9/0025; F28D 9/0006; F28D 1/0308; F28D 7/04; F28D 1/0472;
(Continued)

(56) References Cited

U.S. PATENT DOCUMENTS 1,916,768 A * 7/1933 Melcher .................. F28F 3/083
165/167
3,631,923 A * 1/1972 Izeki ........................ F28B 1/02
165/167
(Continued)

FOREIGN PATENT DOCUMENTS

CN 206525066 U * 9/2017
JP 3208823 U * 2/2017
(Continued)

*Primary Examiner* — Justin Jonaitis
(74) *Attorney, Agent, or Firm* — Jackson IPG PLLC; Demian K. Jackson (57) ABSTRACT

A water cooling heat radiation device and module thereof includes a body structure, composed of a plurality of laminations, a top and a bottom sheet body, and a water pump. Each the lamination has a plurality of radial extended portions and a spiral raised portion. The laminations are stacked to form the body structure, such that the radial extended portions and the spiral raised portions form a plurality of radiation fins and a spiral flow passage, respectively. The spiral flow passage has a water inlet in a water inlet part, and a water outlet, respectively, provided on two ends thereof. The top and the bottom sheet body correspondingly secure a top and a bottom side of the spiral flow passage of the body structure. The water pump is located in the water inlet part, and forms a water cooling heat radiation module with a first and a second pipe.

7 Claims, 8 Drawing Sheets

(58) Field of Classification Search
CPC ....... H01L 23/40; H01L 23/46; H01L 23/473; H01L 23/4735
USPC ... 165/80.4, 166, 244, 80.1, 80.2, DIG. 159, 165/DIG. 185, DIG. 186
See application file for complete search history.

(56) References Cited

U.S. PATENT DOCUMENTS

| | | | | |
|---|---|---|---|---|
| 5,186,238 | A * | 2/1993 | del Puerto | H01L 21/67109 165/80.4 |
| 5,343,936 | A * | 9/1994 | Beatenbough | F28D 9/0012 165/167 |
| 6,575,231 | B1 * | 6/2003 | Wu | H01L 23/467 165/121 |
| 7,073,569 | B1 * | 7/2006 | Joshi | F28F 3/02 165/104.33 |
| 2002/0144809 | A1 * | 10/2002 | Siu | B21D 53/04 165/185 |
| 2002/0195231 | A1 * | 12/2002 | Siu | B21D 53/04 165/104.33 |
| 2003/0164231 | A1 * | 9/2003 | Goodson | F04B 19/006 165/104.11 |

FOREIGN PATENT DOCUMENTS

| | | | | |
|---|---|---|---|---|
| KR | 20140055418 A | * | 5/2014 | ......... F28D 15/0275 |
| TW | M446869 U1 | * | 9/2012 | |

* cited by examiner

WATER COOLING HEAT RADIATION DEVICE AND MODULE THEREOF

FIELD OF THE INVENTION

The present invention relates to a water cooling heat radiation device and module thereof, and more specifically, to a water cooling heat radiation device and module thereof that is composed of a plurality of stacked laminations to form a flow passage to provide improved heat dissipation efficiency.

BACKGROUND OF THE INVENTION

The functions of the currently available electronic devices have been improved. To perform these functions well, the computation performance of electronic devices has been largely upgraded, so is the temperature in the electronic elements. The currently available heat dissipation module can remove heat generated by the electronic elements by a heat spreader, a vapor chamber, a heat pipe, or any combinations thereof, also a cooling fan is applied. However, the heat can be removed from the electronic elements by the heat dissipation module in the electronic devices, but it cannot be dissipated out of the electronic devices. Therefore, water cooling heat radiation module is used to dissipate the heat in the electronic devices. The water cooling heat radiation module includes a water cooling head and a water cooling heat dissipation structure. Also, a circulation passage is provided between the water cooling head and the water cooling heat dissipation structure to connect the water cooling head and the water cooling heat dissipation structure via pipes, such that a cooling water can be circulated. The water cooling head has a heat exchange surface, which is in contact with the electronic elements to transfer the heat. The heat is transferred to the cooling water by the heat exchange surface and taken away, and then the cooling water carries the heat out of the water cooling head and flows into the water cooling heat radiation structure. The heated cooling water is flowed back and forth by an operation of the water pump of the water cooling head to cool down the electronic elements. Still, the water cooling head must have compact volume to meet the restricted space in the electronic devices. It is therefore tried by the inventor to develop an improved water cooling heat radiation device and module thereof to overcome the drawbacks and problems in the conventional water cooling heat radiation device.

Furthermore, there are multiple-complicated passages must be arranged in the water cooling heat radiation structure to enhance heat dissipation efficiency. However, the conventional water cooling heat radiation structure has a plurality of hollow flat pipes, each of which has two ends, respectively, connected to water reservoirs. A plurality of heat radiation fins is disposed among the hollow flat pipes, which are flexible and correspondingly connected to outer side of the flat tubes at junctions therebetween by welding. The two water reservoirs are also connected to the connected flexible heat radiation fins and the flat tubes by welding to form the water cooling heat radiation structure. It is clear that the conventional water cooling heat radiation structure has no complicated passage to effectively dissipate the heat generated by the electronic elements and the heat radiation fins can be easily damaged to cause a malfunction of the water cooling heat radiation structure.

SUMMARY OF THE INVENTION

To solve the above and other problems, a primary object of the present invention is to provide a water cooling heat radiation device that has a cooling fluid which provides improved heat dissipation efficiency.

Another object of the present invention is to provide a water cooling radiation module that has largely reduced volume.

To achieve the above and other objects, the water cooling heat radiation device according to the present invention includes a body structure, a top and a bottom sheet body, and a water pump.

The body structure is composed of a stacked plurality of laminations, and each the lamination has a plurality of radial spaced extended portions and at least one spiral raised portion. The radial extended portions are radially connected to the spiral raised portion. The laminations are stacked to one another to form the body structure, such that the stacked radial extended portions the stacked spiral raised portion respectively form a plurality of radiation fins and a spiral flow passage. The spiral flow passage has a water inlet and a water outlet, respectively, provided on two ends thereof. The top sheet body is correspondingly located above the body structure to secure a top side of the spiral flow passage of the body structure and has a water inlet part, in which a water inlet is located, whereas the bottom sheet body is correspondingly located below the body structure to secure a bottom side of the spiral flow passage of the body structure. The water pump is located in the water inlet part and has a plurality of fan blades.

The water cooling heat radiation module according to the present invention includes a water cooling heat radiation device, a water cooling head, and a first and a second pipe.

The water cooling heat radiation device includes a body structure, a top and a bottom sheet body, and a water pump.

The body structure is composed of a plurality of stacked laminations, and each the lamination has a plurality of radial spaced extended portions and at least one spiral raised portion. The radial extended portions are radially connected to the spiral raised portion. The laminations are stacked to one another to form the body structure, such that the stacked radial extended portions the stacked spiral raised portion respectively form a plurality of radiation fins and a spiral flow passage. The spiral flow passage has a water inlet and a water outlet, respectively, provided on two ends thereof. The top sheet body is correspondingly located above the body structure to secure a top side of the spiral flow passage of the body structure and has a water inlet part, in which a water inlet is located, whereas the bottom sheet body is correspondingly located below the body structure to secure a bottom side of the spiral flow passage of the body structure. The water pump is located in the water inlet part and has a plurality of fan blades.

The water cooling head has a housing, which has at least one water reservoir, a heat exchange surface, a water inlet, and a water outlet. The water inlet and the water outlet is connected to the water reservoir, and the heat exchange surface is located on one side of the housing and connected to the water reservoir. a first pipe has a first and a second end, which is connected to the water inlet of the water cooling head and the water outlet of the body structure of the water cooling heat radiation device, respectively, whereas a second pipe has a third and a fourth end, which is connected to the water outlet of the water cooling head and the water inlet of the body structure of the water cooling heat radiation device, respectively.

With these arrangements, the water cooling heat radiation device not only can provide improved cooling effect, but also can have complicated flow passage via the stacked laminations, so as to have cooling fluid that can have enhanced cooling efficiency.

Moreover, after the water cooling heat radiation device is combined with the water pump, the water cooling heat radiation device can have largely reduced volume, and the water cooling head further can be detachably assembled to one another in use.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

The present invention will now be described with some preferred embodiments thereof and by referring to the accompanying drawings. For the purpose of easy to understand, elements that are the same in the preferred embodiments are denoted by the same reference numerals.

Figure 1:
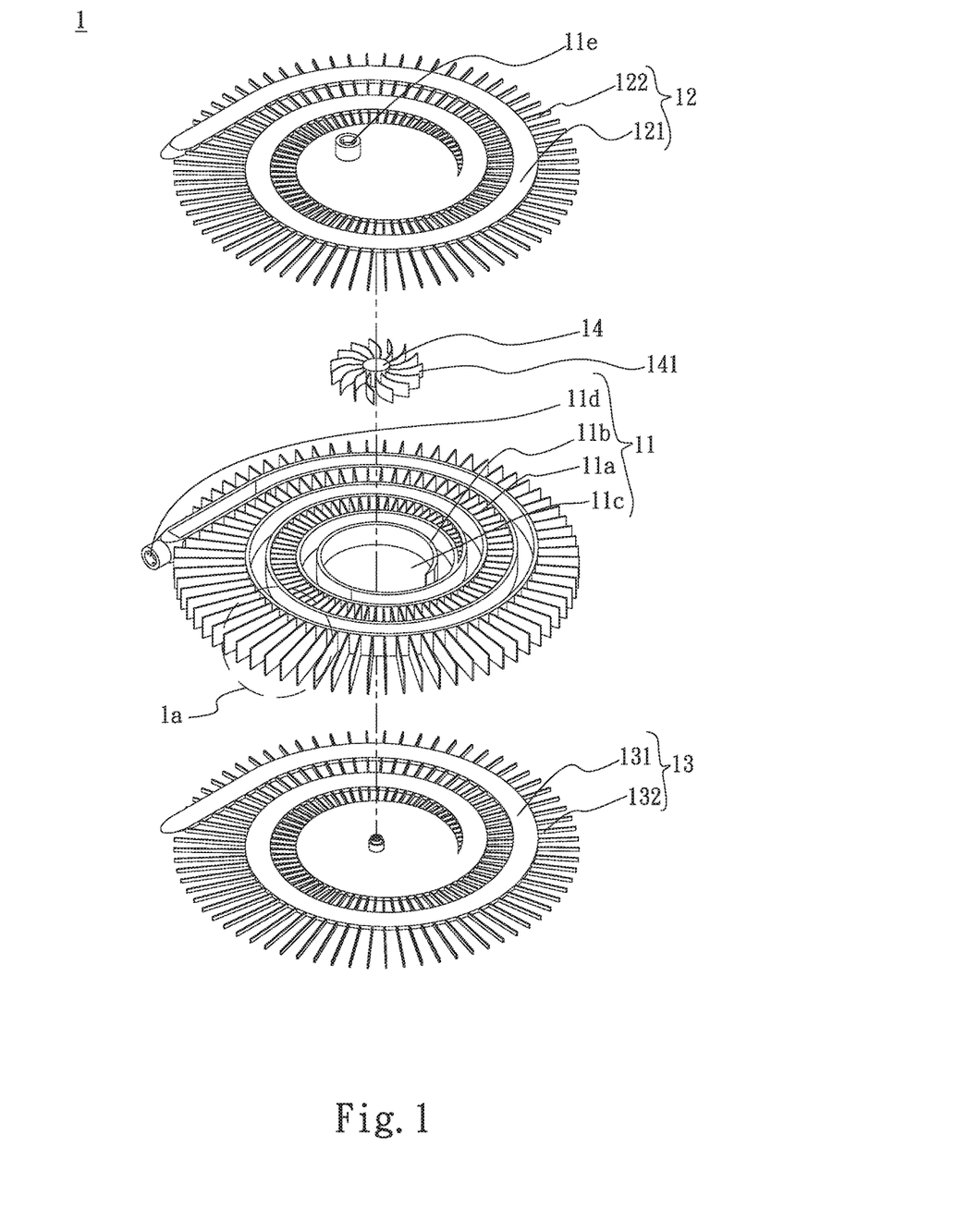
FIG. 1 is an exploded perspective view of a water cooling heat radiation device according to a first embodiment of the present invention.
Figure 1A:
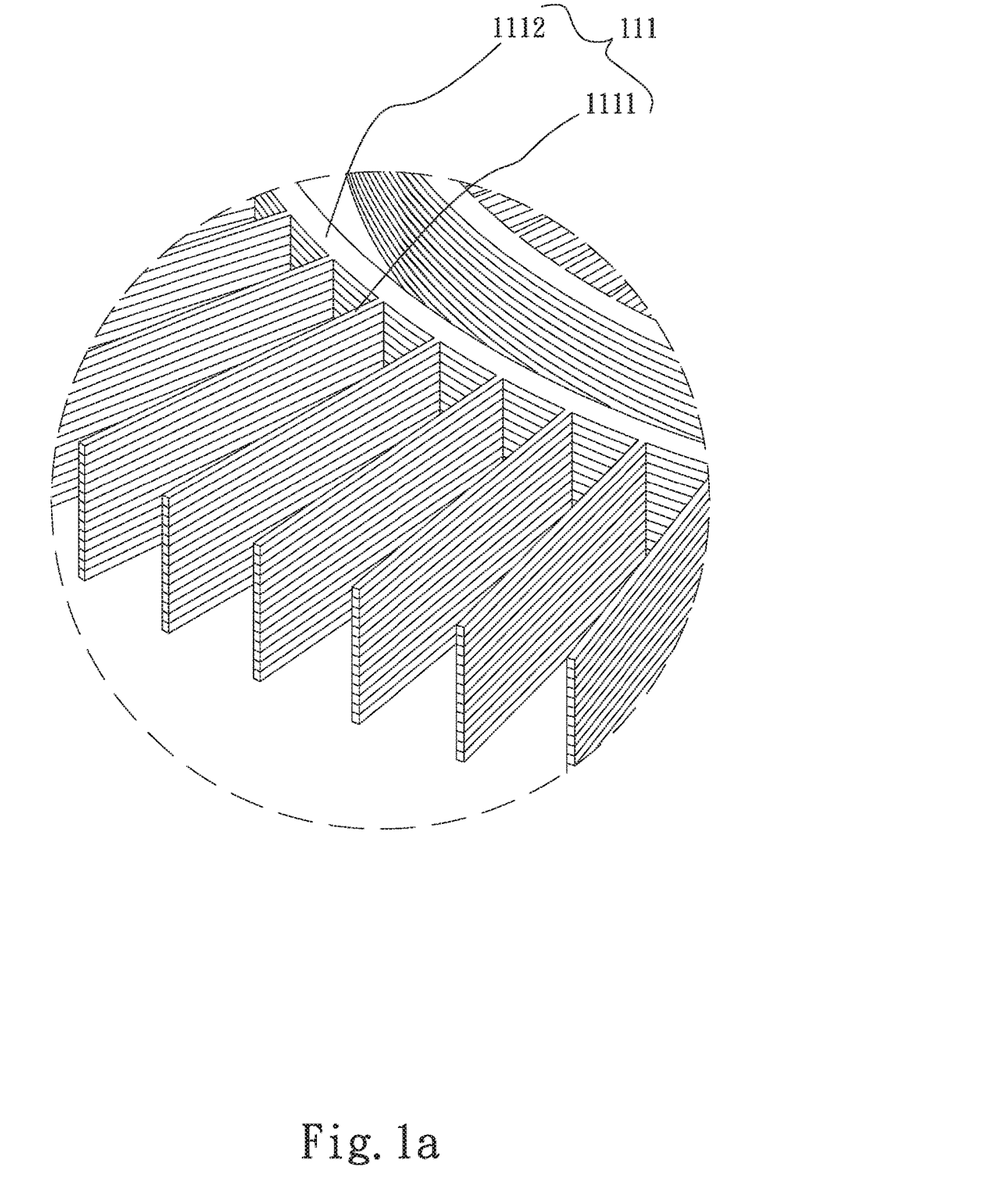
FIG. 1a is a partially enlarged view of the circled area in FIG. 1.
Figure 2:
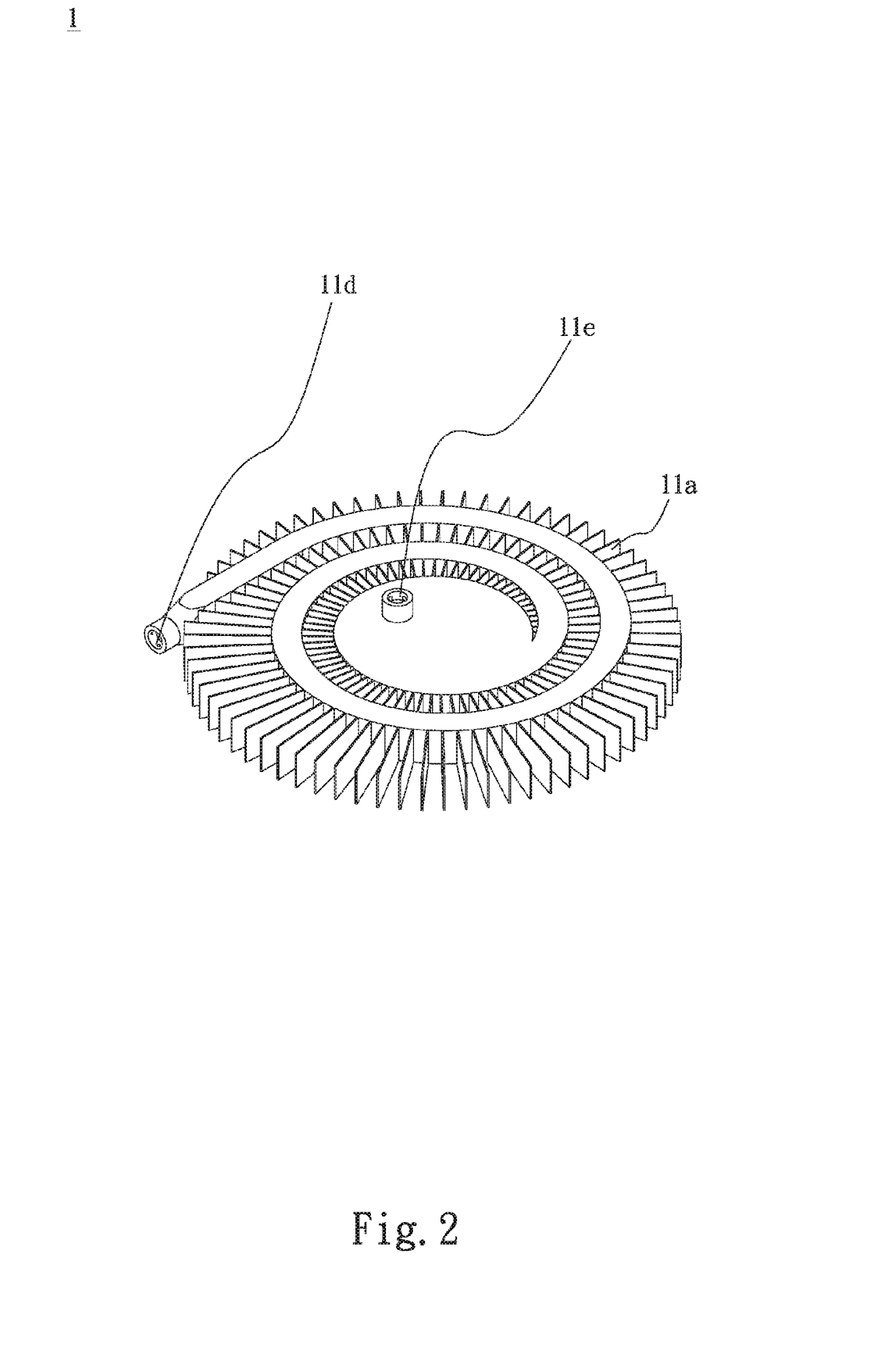
FIG. 2 is an assembled perspective view of FIG. 1.

Please refer to FIGS. 1 and 2, which are exploded and assembled perspective views, respectively, of a water cooling heat radiation device 1 according to a first embodiment of the present invention, and FIG. 1a, which is a partially enlarged view of the circled area in FIG. 1. For the purpose of conciseness, the present invention is also briefly referred to as the water cooling device and generally denoted by reference numeral 1. As shown, the water cooling heat radiation device 1 includes a body structure 11, a top and a bottom sheet body 12, 13, and a water pump 14.

The body structure 11 is composed of a plurality of stacked laminations 111, and each the lamination 111 has a plurality of radial spaced extended portions 1111 and at least one spiral raised portion 1112. The radial extended portions 1111 are radially connected to the spiral raised portion 1112. The laminations 111 are stacked to one another to form the body structure 11, such that the stacked radial extended portions 1111 the stacked spiral raised portion 1112 respectively form a plurality of radiation fins 11a and a spiral flow passage 11b. The spiral flow passage 11b has a water inlet 11e and a water outlet 11d, respectively, provided on two ends thereof.

The top sheet body 12 is correspondingly located above the body structure 11 to secure a top side of the spiral flow passage 11b of the body structure 11 and has a water inlet part 11c, in which the water inlet 11e is located, whereas the bottom sheet body 13 is correspondingly located below the body structure 11 to secure a bottom side of the spiral flow passage 11b of the body structure 11. The water pump is located in the water inlet 11 of the water inlet part 11c and has a plurality of fan blades 141.

The top sheet body 12 has a first spiral secured portion 121 located correspondingly to secure the top side of the spiral flow passage 11b of the body structure 11, and the first spiral secured portion 121 is connected to a plurality of top radial extended portions 122. The top radial extended portions 122 of the top sheet body 12 are correspondingly stacked and connected to the radial extended portions 1111 of the body structure 11.

The bottom sheet body 13 has a second spiral secured portion 131 located correspondingly to secure the bottom side of the spiral flow passage 11b of the body structure 11, and the second spiral secured portion 131 is connected to a plurality of bottom radial extended portions 132. The bottom radial extended portions 132 of the bottom sheet body 13 are correspondingly stacked and connected to the radial extended portions 1111 of the body structure 11.

Figure 3:
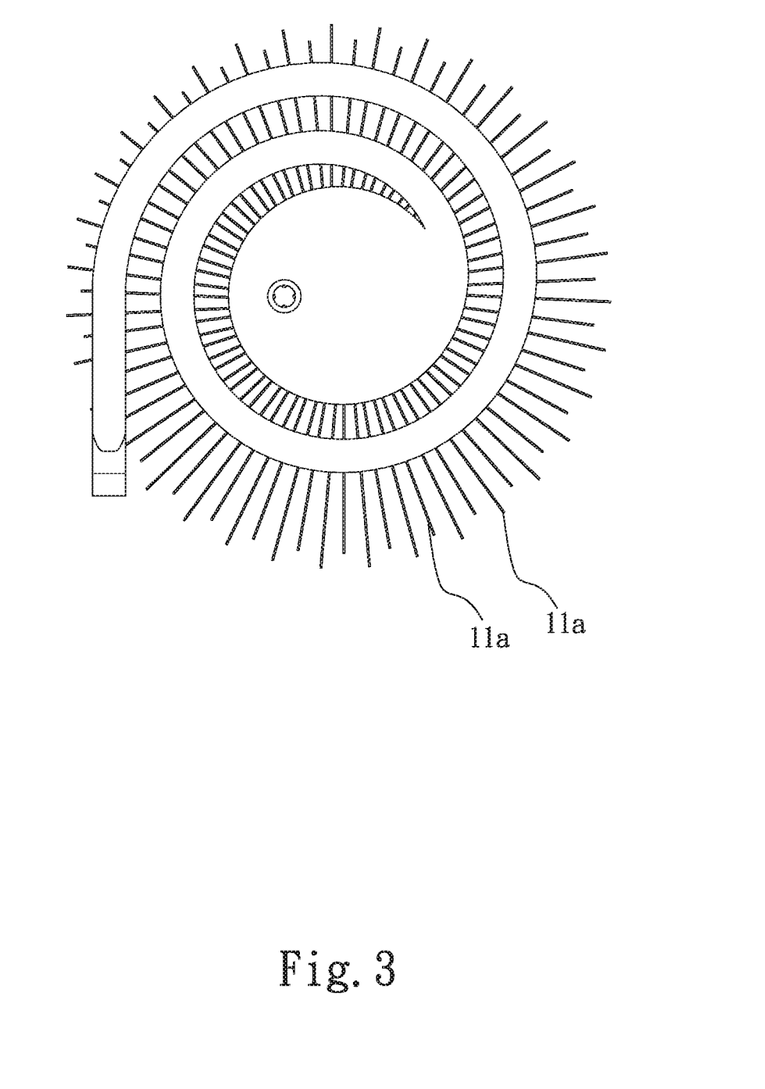
FIG. 3 is a top view of the water cooling heat radiation device according to a second embodiment of the present invention.

Please refer to FIG. 3, which is a top view of the water cooling device 1 according to a second embodiment of the present invention. The second embodiment of the water cooling device 1 is generally structurally similar to the first embodiment except that, in this second embodiment, the radiation fins 11a can have different or the same lengths.

Figure 4:
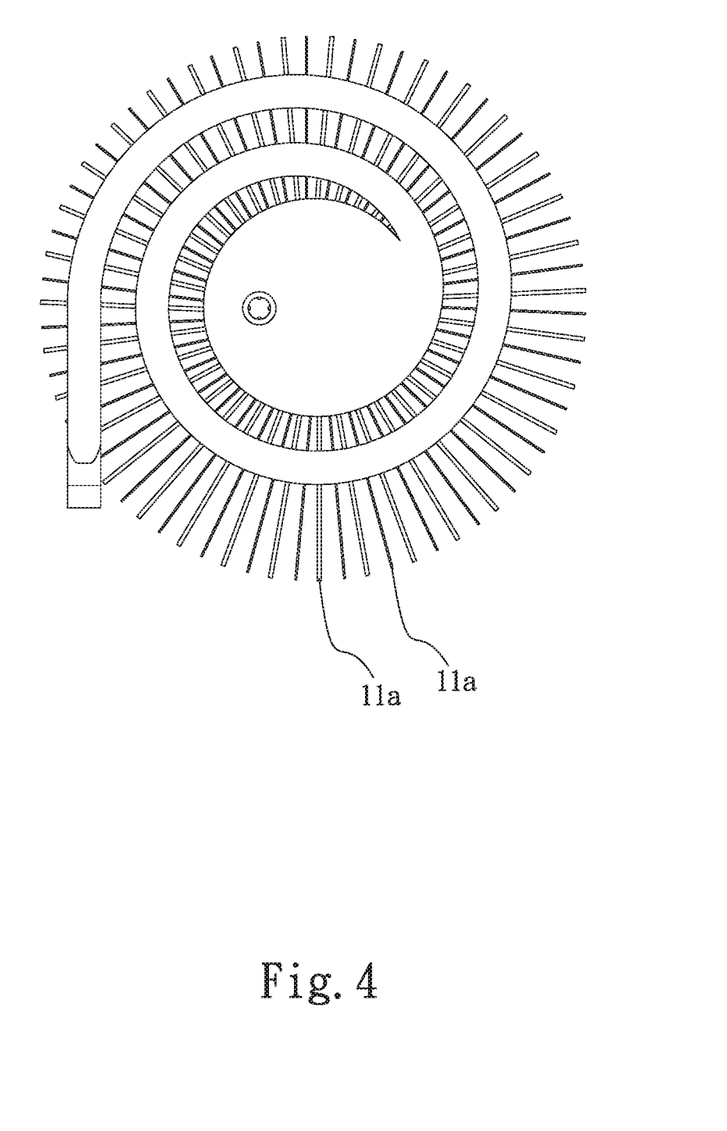
FIG. 4 is a top view of the water cooling heat radiation device according to a third embodiment of the present invention.

Please refer to FIG. 4, which is a top view of the water cooling device 1 according to a third embodiment of the present invention. The third embodiment of the water cooling device 1 is generally structurally similar to the first embodiment except that, in this third embodiment, the radiation fins 11a can have, for example but not limited to, different or the same thicknesses.

Figure 5:
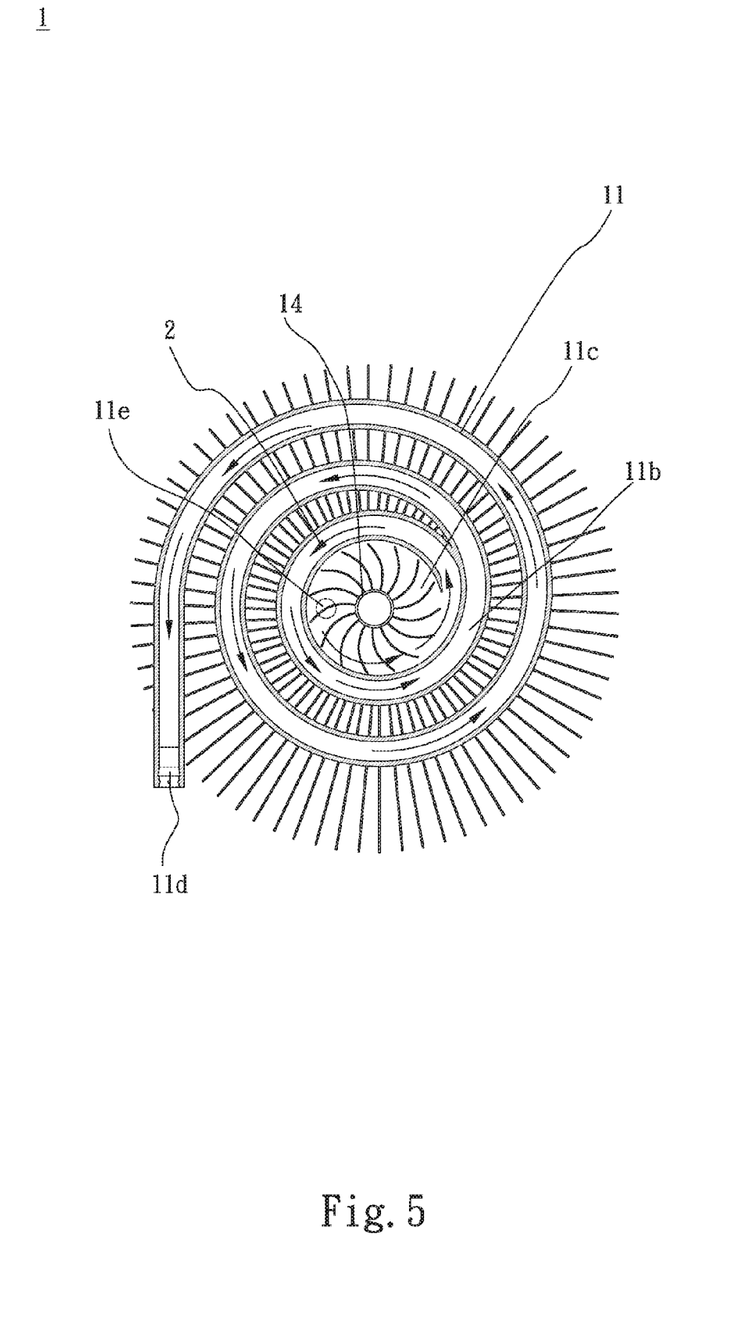
FIG. 5 shows the working manner of the water cooling heat radiation device according to the preferred embodiment of the present invention.

Please refer to FIG. 5, which shows the working manner of the water cooling device 1 according to the preferred embodiment of the present invention. As shown, the water inlet part 11c is ranged eccentrically, such that the cooling fluid 2 is directed into the water inlet part 11c via the water inlet 11e, and then the cooling fluid 2 is outwardly flowed from a center of the spiral flow passage 11b by an operation of the water pump 14. After that, the cooling fluid 2 is flowed out of the body structure 11 from the water outlet 11d, located on the outmost portion of the spiral flow passage 11b, of the body structure 11.

Figure 6:
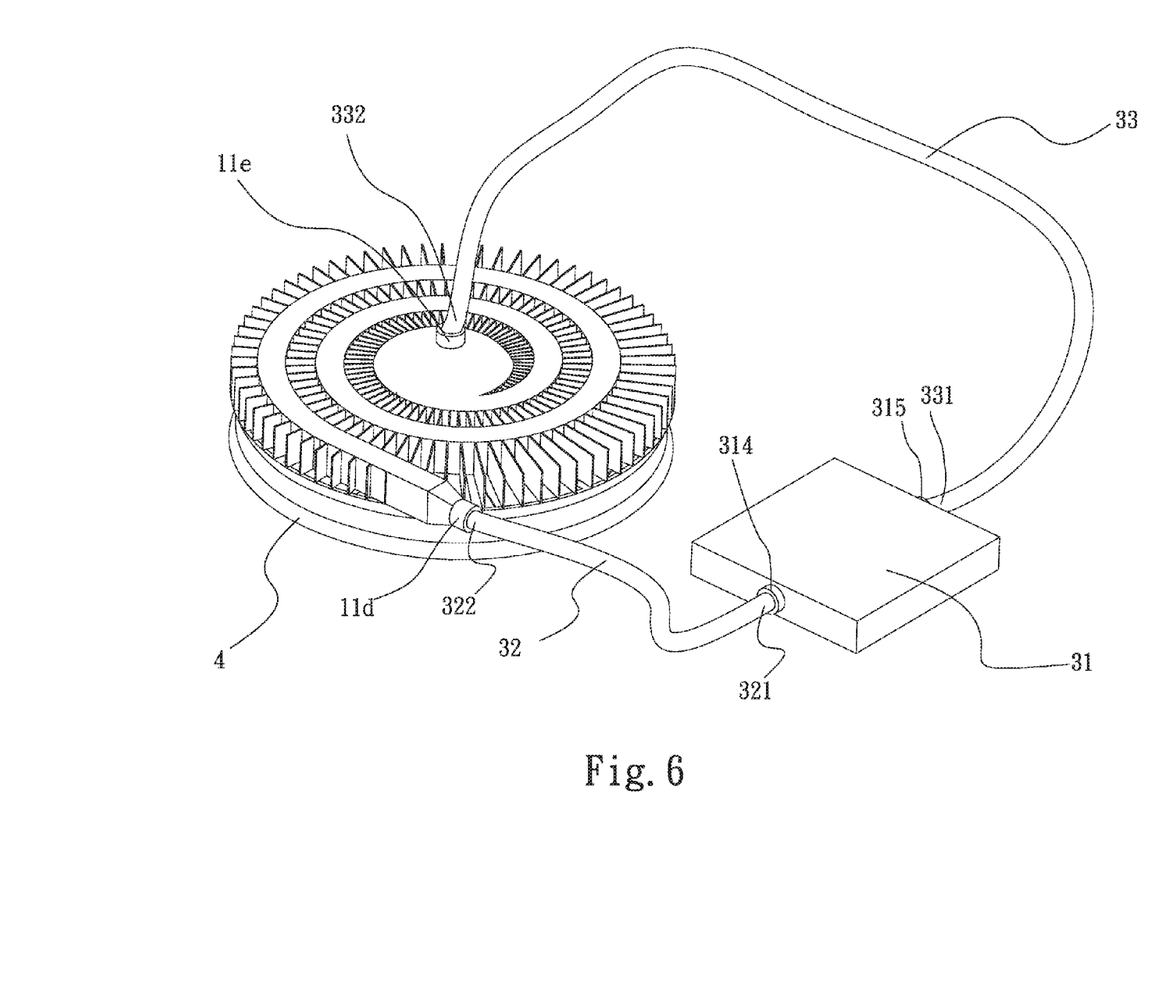
FIG. 6 is an exploded perspective view of a water cooling heat radiation module included in the water cooling heat radiation device.
Figure 7:
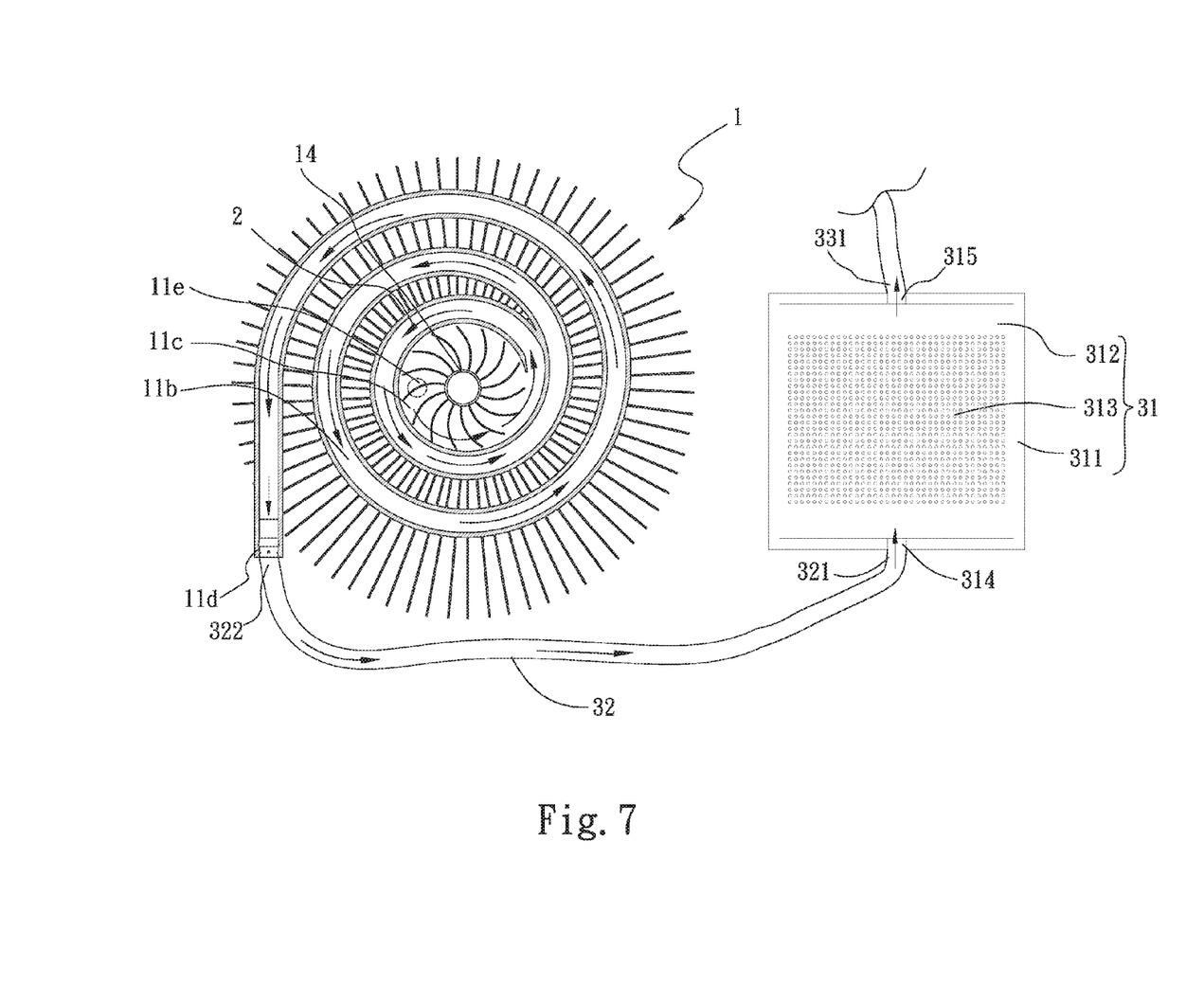
FIG. 7 is an assembled perspective view of FIG. 6.

Please refer to FIGS. band 7, which are exploded and assembled perspective views, respectively, of a water cooling heat radiation module 3 included in the water cooling device 1. The water cooling heat radiation module 3 according to the present invention includes a water cooling heat radiation device 1, a water cooling head 31, and a first and a second pipe 32, 33.

Please refer to FIGS. 1 to 5 again. The water cooling device 1 included in the water cooling heat radiation module 3 is generally structurally similar to the water cooling device 1 in the first, the second, and the third embodiments. The body structure 11 is connected to the water cooling head 31 via the first and the second pipe 32, 33. The water cooling head 31 has a housing 311, which has at least one water reservoir 312, a heat exchange surface 313, a water inlet 314, and a water outlet 315. The water inlet and the water outlet 314, 315 are connected to the water reservoir 312. The heat exchange surface 313 is located on one side of the housing 311 and connected to the water reservoir 312.

The first pipe 32 has a first and a second end 321, 322, which is connected to the water inlet 314 of the water cooling head 31 and the water outlet 11d of the body structure 11 of the water cooling device 1, respectively.

The second pipe 33n has a third and a fourth end 331, 332, which is connected to the water outlet 315 of the water cooling head 31 and the water inlet 11e of the body structure 11 of the water cooling device 1, respectively.

The water cooling device 1 further includes a cooling fan 4 located on one side thereof. The cooling fan 4 is located corresponding to the water cooling device 1 to forcedly cool down the heat generated by the heat source, so as to have greatly improved heat dissipation efficiency.

When the water cooling heat radiation module 3 is in operation, the water cooling head 31 is in contact with at least one heat source (not shown) and absorbs heat generated by the heat source. The heat is transferred to the cooling fluid 2 by the heat exchange surface 313 and taken away, then the cooling fluid 2 carries the heat out of the water cooling head 31 via the water outlet 31 and flows into the water cooling device 1 via the second pipe 33. The heated cooling fluid 2 is then flowed into the water inlet part 11c from the water inlet 11c of the water cooling device 1. Then the heated cooling fluid 2 is flowed in a direction of the spiral flow passage 11b by the operation of the water pump 14 from the water inlet part 11c, and further flowed outwardly from the center of the spiral flow passage 11. The heat then is transferred to the water cooling device 1 when the heated cooling fluid 2 stays in the spiral flow passage 11b, and the cooling device 1 and the heated cooling fluid 2 is, respectively, forcedly cooled down by the cooling fan 4, such that the cooling fluid 2 is flowed out of the water cooling device 1 via the water outlet 11d and further into the water cooling head 31 via the water inlet 31 of the water cooling head 31 to complete the whole heat dissipation circulation.

With these arrangements, the water cooling device 1 not only can provide improved cooling effect, but also can have complicated flow passage via the stacked laminations 111, so as to have cooling fluid that can have enhanced cooling efficiency, as well as have radiation fins that is hard to be break down by an external force.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A water cooling heat radiation device, comprising:
a body structure, which is composed of a plurality of laminations; each the lamination having a plurality of radial spaced extended portions and at least one spiral raised portion; the radial extended portions radially connected to the spiral raised portion; the laminations being stacked to one another to form the body structure, such that the stacked radial extended portions and the stacked spiral raised portion respectively form a plurality of radiation fins and a spiral flow passage, which having a water inlet and a water outlet, respectively, provided on two ends thereof;
a top sheet body being correspondingly located above the body structure to secure a top side of the spiral flow passage of the body structure and having a water inlet part, in which a water inlet being located;
a bottom sheet body being correspondingly located below the body structure to secure a bottom side of the spiral flow passage of the body structure; and
a water pump being located in the water inlet part and having a plurality of fan blades.

2. The water cooling heat radiation device as claimed in claim 1, wherein the top sheet body has a first spiral secured portion located correspondingly to secure the top side of the spiral flow passage of the body structure; the first spiral secured portion being connected to a plurality of top radial extended portions;
and the top radial extended portions of the top sheet body being correspondingly connected to the radial extended portions of the body structure.

3. The water cooling heat radiation device as claimed in claim 1, wherein the bottom sheet body has a second spiral secured portion located correspondingly to secure the bottom side of the spiral flow passage of the body structure; the second spiral secured portion being connected to a plurality of bottom radial extended portions; and the bottom radial extended portions of the bottom sheet body being correspondingly connected to the radial extended portions of the body structure.

4. The water cooling heat radiation device as claimed in claim 1, wherein the radiation fins can have different or the same lengths.

5. The water cooling heat radiation device as claimed in claim 1, wherein the radiation fins can have different or the same thicknesses.

6. A water cooling heat radiation module, comprising:
a water cooling heat radiation device comprising:
a body structure, which is composed of a plurality of laminations; each the lamination having a plurality of radial spaced extended portions and at least one spiral raised portion; the radial extended portions radially connected to the spiral raised portion; the laminations being stacked to one another to form the body structure, such that the stacked radial extended portions and the stacked spiral raised portion respectively form a plurality of radiation fins and a spiral flow passage, which having a water inlet and a water outlet, respectively, provided on two ends thereof;
a top sheet body being correspondingly located above the body structure to secure a top side of the spiral flow passage of the body structure and having a water inlet part, in which a water inlet being located;
a bottom sheet body being correspondingly located below the body structure to secure a bottom side of the spiral flow passage of the body structure; and
a water pump being located in the water inlet part and having a plurality of fan blades;
a water cooling head having a housing, which having at least one water reservoir, a heat exchange surface, a water inlet, and a water outlet; the water inlet and the water outlet being connected to the water reservoir; and the heat exchange surface being located on one side of the housing and connected to the water reservoir;
a first pipe having a first and a second end, which being connected to the water inlet of the water cooling head and the water outlet of the body structure of the water cooling heat radiation device, respectively; and
a second pipe having a third and a fourth end, which being connected to the water outlet of the water cooling head and the water inlet of the body structure of the water cooling heat radiation device, respectively.

7. The water cooling heat radiation module as claimed in claim 6, further comprising a cooling fan, which being located on one side of the water cooling heat radiation device.

* * * * *